(12) United States Patent
Wang et al.

(10) Patent No.: US 11,538,875 B2
(45) Date of Patent: Dec. 27, 2022

(54) DISPLAY SUBSTRATE, MANUFACTURING METHOD THEREOF, DISPLAY DEVICE

(71) Applicant: BOE TECHNOLOGY GROUP CO., LTD., Beijing (CN)

(72) Inventors: Can Wang, Beijing (CN); Can Zhang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 712 days.

(21) Appl. No.: 16/339,614

(22) PCT Filed: Nov. 13, 2018

(86) PCT No.: PCT/CN2018/115207
§ 371 (c)(1),
(2) Date: Apr. 4, 2019

(87) PCT Pub. No.: WO2019/205586
PCT Pub. Date: Oct. 31, 2019

(65) Prior Publication Data
US 2021/0359041 A1 Nov. 18, 2021

(30) Foreign Application Priority Data
Apr. 24, 2018 (CN) .......................... 201810372175.3

(51) Int. Cl.
*H01L 27/32* (2006.01)
*H01L 51/56* (2006.01)

(52) U.S. Cl.
CPC ...... *H01L 27/3246* (2013.01); *H01L 27/3283* (2013.01); *H01L 51/56* (2013.01); *H01L 2227/326* (2013.01)

(58) Field of Classification Search
None
See application file for complete search history.

(56) References Cited

U.S. PATENT DOCUMENTS

2003/0178936 A1 9/2003 Park et al.
2007/0091062 A1* 4/2007 French ................... G02F 1/167
345/107

(Continued)

FOREIGN PATENT DOCUMENTS

CN 103022375 A 4/2013
CN 103268921 A 8/2013
(Continued)

OTHER PUBLICATIONS

"Communication with Supplementary European Search Report", EP Application No. 18859955.9, dated Dec. 17, 2021, 7 pp.
(Continued)

*Primary Examiner* — Nishath Yasmeen
(74) *Attorney, Agent, or Firm* — Myers Bigel, P.A.

(57) ABSTRACT

A display substrate, a manufacturing method thereof, and a display device are provided. The display substrate includes a base substrate, a pixel defining layer, and a first electrode layer between the base substrate and the pixel defining layer. The pixel defining layer defines a plurality of sub-pixels on the base substrate, the first electrode layer comprises a plurality of first electrodes, and the plurality of first electrodes being separated from each other by gaps, and an orthographic projection of the pixel defining layer on the base substrate covers an orthographic projection of the gap on the base substrate.

17 Claims, 4 Drawing Sheets

(56) References Cited

U.S. PATENT DOCUMENTS

| | | | |
|---|---|---|---|
| 2010/0265571 A1* | 10/2010 | Wang | G02B 5/1857 359/485.05 |
| 2011/0134018 A1* | 6/2011 | Seo | H01L 51/003 445/24 |
| 2011/0279023 A1* | 11/2011 | Nishioka | H01L 27/3253 445/24 |
| 2012/0161167 A1* | 6/2012 | Yamazaki | H01L 27/3204 438/34 |
| 2012/0193646 A1 | 8/2012 | Zhang et al. | |
| 2012/0298841 A1* | 11/2012 | Yamashita | H01L 27/14647 257/432 |
| 2014/0103385 A1* | 4/2014 | Hatano | H01L 33/005 438/28 |
| 2015/0179723 A1* | 6/2015 | Chien | H01L 51/0023 438/34 |
| 2016/0035802 A1 | 2/2016 | Wang et al. | |
| 2018/0281361 A1* | 10/2018 | Oda | B32B 27/34 |
| 2018/0301521 A1 | 10/2018 | Yang | |
| 2019/0157353 A1 | 5/2019 | Wang et al. | |
| 2019/0165322 A1* | 5/2019 | Shinya | H01L 51/56 |

FOREIGN PATENT DOCUMENTS

| | | |
|---|---|---|
| CN | 103545457 A | 1/2014 |
| CN | 106876331 A | 6/2017 |
| CN | 107946345 A | 4/2018 |
| WO | 2011/018110 A1 | 2/2011 |
| WO | WO2018034040 * | 5/2017 |
| WO | 2018034040 A1 | 2/2018 |

OTHER PUBLICATIONS

International Search Report and Written Opinion of the International Searching Authority (w/English language translation), International Application No. PCT/CN2018/115207, dated Feb. 12, 2019, 12 pp.

* cited by examiner

DISPLAY SUBSTRATE, MANUFACTURING METHOD THEREOF, DISPLAY DEVICE

CROSS REFERENCE TO RELATED APPLICATIONS

The present application is a 35 U.S.C. 371 national stage application of PCT International Application No. PCT/CN2018/115207, filed on Nov. 13, 2018, which claims the benefit of Chinese Patent Application No. 201810372175.3, filed on Apr. 24, 2018, the contents of which are incorporated herein by reference in their entireties.

TECHNICAL FIELD

The present disclosure relates to the field of display technologies, and particularly to a display substrate, a manufacturing method thereof, and a display device.

BACKGROUND

With the rapid development and wide application of display technologies, display substrates, as an important component for display devices, have attracted more and more attentions.

For display devices having high PPI (Pixels Per Inch), micro-display products such as VR (Virtual Reality) display devices and AR (Augmented Reality) display devices which have a very high requirement on PPI (greater than 2000), due to a small spacing (typically less than 1 micron) between pixels, crosstalk is prone to occur between pixels. The so-called crosstalk means a phenomenon that when a pixel is being supplied with a driving voltage or current to emit light, adjacent pixels even pixels of the same row or the same column also emit slight light.

SUMMARY

An embodiment of the present disclosure provides a display substrate. The display substrate comprises a base substrate, a pixel defining layer, and a first electrode layer between the base substrate and the pixel defining layer. The pixel defining layer defines a plurality of sub-pixels on the base substrate, the first electrode layer comprises a plurality of first electrodes, the plurality of first electrodes being separated from each other by gaps, an orthographic projection of the pixel defining layer on the base substrate covers that of the gaps on the base substrate.

In some embodiments, each of the gaps is a vacuum gap.

In some embodiments, each of the gaps is filled with air.

In some embodiments, each of the gaps is filled with nitrogen.

In some embodiments, each sub-pixel comprises one of the plurality of first electrodes, a light emitting layer, and a second electrode, the light emitting layer is between the first electrode and the second electrode, respective second electrodes of the sub-pixels are connected to each other to form a second electrode layer.

In some embodiments, the pixel defining layer is between the second electrode layer and the first electrode layer, and the second electrode layer is in contact with and covers upper surfaces of the pixel defining layer and the light emitting layer facing away from the base substrate.

In some embodiments, a thickness of the pixel defining layer in a vertical direction perpendicular to the base substrate is greater than a thickness of the light emitting layer of each sub-pixel in the vertical direction.

Another embodiment of the disclosure provides a display device comprising the display substrate according to any one of foregoing embodiments.

A further embodiment of the disclosure provides a manufacturing method for a display substrate, comprising: forming a first electrode layer on a base substrate, the first electrode layer comprising a plurality of first electrodes separated from each other by gaps; forming a plastic material layer on a sacrificial substrate; laminating the base substrate and the sacrificial substrate to adhere the plastic material layer to the plurality of first electrodes; removing the sacrificial substrate; and patterning the plastic material layer such that the plurality of first electrodes are exposed and the gaps are located between a patterned plastic material layer and the base substrate.

In some embodiments, the manufacturing method further comprises: after patterning the plastic material layer, forming a light emitting layer and a second electrode layer on the first electrode layer successively.

In some embodiments, the patterned plastic material layer is between the second electrode layer and the first electrode layer, and the second electrode layer is in contact with and covers upper surfaces of the patterned plastic material layer and the light emitting layer facing away from the base substrate.

In some embodiments, a thickness of the patterned plastic material layer in a vertical direction perpendicular to the base substrate is greater than a thickness of the light emitting layer in the vertical direction.

In some embodiments, the plastic material is a thermoplastic material.

In some embodiments, the base substrate and the sacrificial substrate are laminated by hot pressing.

In some embodiments, the step of laminating the base substrate and the sacrificial substrate comprises: laminating the base substrate and the sacrificial substrate in an air or nitrogen atmosphere.

In some embodiments, the step of laminating the base substrate and the sacrificial substrate comprises laminating the base substrate and the sacrificial substrate in a vacuum environment.

In some embodiments, the manufacturing method comprises forming a sacrificial layer on the sacrificial substrate prior to forming the plastic material layer on the sacrificial substrate.

In some embodiments, the step of removing the sacrificial substrate comprises irradiating the sacrificial layer with laser light to remove the sacrificial substrate.

In some embodiments, the step of patterning the plastic material layer comprises patterning the plastic material layer using a nanoimprint process.

Other features and advantages of the present disclosure will be apparent from the following detailed description of exemplary embodiments of the present disclosure with reference to the accompanying drawings.

BRIEF DESCRIPTION OF DRAWINGS

The accompanying drawings, which constitute a part of the specification, illustrate embodiments of the present disclosure, and are used for explaining the principle of the present disclosure together with the following description.

The present disclosure can be more clearly understood from the following detailed description with reference to the accompanying drawings, in which.

It is to be understood that the dimensions of the various parts shown in the drawings are not drawn to scale. In addition, the same or similar reference numerals denote the same or similar members.

DETAILED DESCRIPTION OF EMBODIMENTS

Various exemplary embodiments of the present disclosure will now be described in detail with reference to the drawings. The description of the exemplary embodiments is merely illustrative, and is in no way intended to limit the present disclosure as well as its applications or usages. The present disclosure can be implemented in many different forms and is not limited to the embodiments described herein. The embodiments are provided to make the present disclosure thorough and complete, and to fully express the scope of the present disclosure. Unless specifically defined otherwise, the relative arrangements of members and steps, the components of materials, the expressions and the numerical values set forth in the embodiments are to be construed as being illustrative only rather than limiting.

The words such as "first", "second" and the like used herein do not denote any order, quantity, or importance, but are used to distinguish different components. The words such as "comprise" and the like indicate that an element preceding the word encompasses elements listed after the word, and do not exclude the possibility of also encompassing other elements. "Upper", "lower", "left", "right", etc. are only used to indicate relative positional relationships. If the absolute positions of the objects described are changed, the relative positional relationships may change accordingly.

In the present disclosure, when it is described that a certain element is located between a first element and a second element, an intervening element may be present between the certain element and the first element or the second element, or no intervening element may be present.

All terms (including technical or scientific terms) used in the present disclosure have the same meanings as understood by those ordinarily skilled in the art to which the present disclosure pertains, unless specifically defined otherwise. It is also to be understood that terms defined in, for example, a general dictionary should be interpreted as having meanings consistent with their meanings in the context of the related art, rather than interpreted with idealized or extremely formal meanings, unless explicitly defined herein.

Techniques, methods and apparatuses known to those ordinarily skilled in the related art may not be discussed in detail, but the techniques, methods and apparatuses should be regarded as part of the specification, where appropriate.

Figure 1:
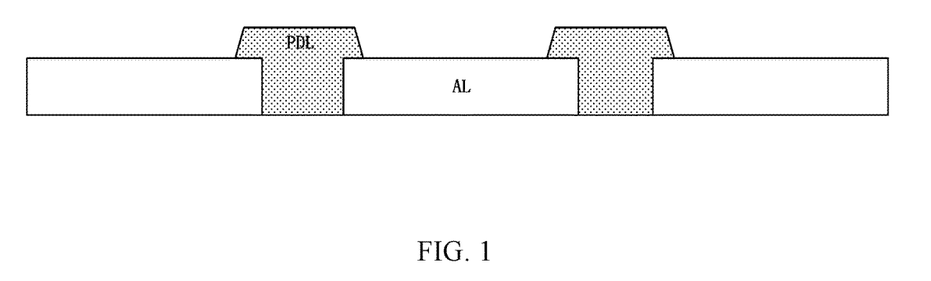
FIG. 1 is a view illustrating a method for reducing crosstalk between pixels, which is known to the inventors of the present application.

FIG. 1 is a method for reducing crosstalk between pixels, which is known to the inventors. As shown in FIG. 1, a pixel defining layer PDL is filled between adjacent pixel electrodes ALs (e.g., anodes in OLED pixels). The PDL is typically made of a resin material with a large dielectric constant between 2.7 and 6.

The parasitic capacitance between anodes will be analyzed below based on an example in which the anodes in an OLED display panel are metal electrode plates. The parasitic capacitance may be expressed as $C=\varepsilon s/d$, where $\varepsilon$ is the dielectric constant of a dielectric between electrode plates, s is the area of an electrode plate, and d is the spacing between electrode plates. For micro-display products, adjacent anodes have a small spacing d that is typically less than 1 micron, which results in a large value of C. Since a crosstalk current I between pixels is proportional to the parasitic capacitance C, the larger C is, the greater I will be, that is, the severer the crosstalk is.

Having realized the above problem, the inventors of the present application propose the following solution to effectively reduce crosstalk between pixels. Embodiments of the solution proposed by the inventors is will be specifically described below by way of example.

A display substrate according to an embodiment of the present disclosure comprises a base substrate, a pixel defining layer, and a first electrode layer between the base substrate and the pixel defining layer. The pixel defining layer defines a plurality of sub-pixels on the base substrate. The first electrode layer includes a plurality of first electrodes, and the plurality of first electrodes are separated from each other by gaps. The orthographic projection of the pixel defining layer on the base substrate covers the orthographic projection of the gap on the base substrate.

In the description below, embodiments of the display substrate proposed herein will be specifically described taking an OLED display panel as an example. However, this does not mean that the inventive concept embodied herein is applied only to an OLED display panel, and instead, the inventive concept revealed by embodiments of the present disclosure is also applicable to other display devices such as LCD display panels. In case the display substrate described above is applied to an OLED display panel, the first electrode described above may be an anode or a cathode of the OLED. If the display substrate described above is applied to an LCD display panel, the first electrode may be a pixel electrode or a common electrode.

Figure 2:
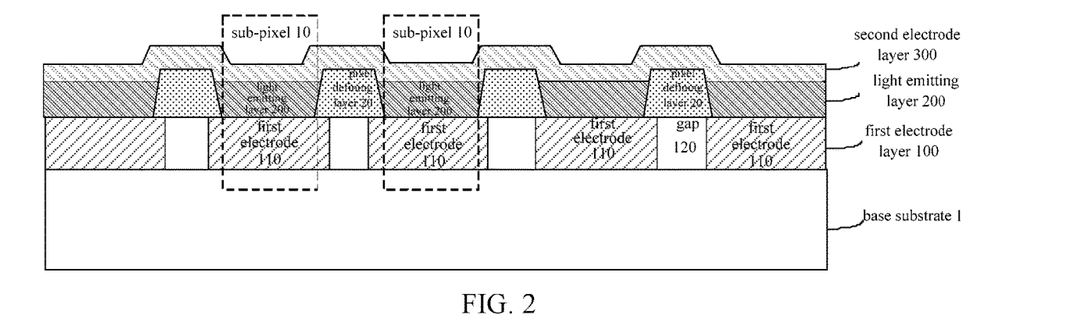
FIG. 2 is a schematic view illustrating the structure of a display substrate according to some embodiments of the present disclosure.

FIG. 2 is a schematic view showing the structure of a display substrate according to some embodiments of the present disclosure.

As shown in FIG. 2, a pixel defining layer 20 defines a plurality of sub-pixels 10 on a base substrate 1. The sub-pixels of the plurality of sub-pixels 10 are separated from each other by the pixel defining layers 20. Each of the sub-pixels 10 includes a light emitting layer 200, and a first electrode 110 and a second electrode located on two sides of the light emitting layer 200 respectively. The second electrodes of the respective sub-pixels may be connected to each other to form a continuous second electrode layer 300.

In some embodiments, the pixel defining layer 20 includes a plastic material, for example, a polymer material such as polyimide (PI), polydimethylsiloxane (PDMS), and the like.

The first electrode layer 100 is located on a side of the light emitting layer 200 facing the base substrate 1. The first electrode layer 100 includes a plurality of first electrodes 110, and the first electrodes 110 are separated from each other by gaps 120. The gap 120 is also located between the base substrate 1 and the pixel defining layer 20. The orthographic projection of the pixel defining layer 20 on the base substrate covers the orthographic projection of the gap 120 on the base substrate. The second electrode layer 300 is located on a side of the light emitting layer 200 away from the base substrate 1.

In the example of FIG. 2, the pixel defining layer 20 is between the second electrode layer 300 and the first electrode layer 100, and the second electrode layer 300 is in contact with and covers the upper surfaces of the pixel defining layer 20 and the light emitting layer 200 facing away from the base substrate 1. Further, the thickness of the pixel defining layer 20 in a vertical direction perpendicular to the base substrate 1 is greater than the thickness of the light emitting layer 200 of each of the sub-pixels in the vertical direction.

As can be seen from FIG. 2, the gap 120 enclosed by adjacent first electrodes 110, the pixel defining layer 20 and the base substrate 1 is a cavity. The gap or cavity defines a space that is not occupied by solids or liquids. The gap may be a vacuum or may be filled with a gas. The vacuum has a minimum dielectric constant of 1. Gases such as hydrogen, helium, oxygen, nitrogen, argon, etc. also have a small dielectric constant which is close to 1.

In some embodiments, the gas in the gap is air. As a mixture of various gases such as hydrogen, oxygen and nitrogen, air has a dielectric constant close to 1, which is much smaller than the dielectric constant of the pixel defining layer. Since the parasitic capacitance between the first electrodes is positively correlated with, e.g., proportional to, the dielectric constant of a dielectric therebetween, air filled between the first electrodes can effectively reduce the parasitic capacitance between the first electrodes. In addition, filling the gap between the first electrodes with air is easy to implement and low in cost.

In other embodiments, the gas in the gap is nitrogen. The dielectric constant of nitrogen is also close to 1, which is much smaller than the dielectric constant of the pixel defining layer. Therefore, nitrogen being filled between the first electrodes can also effectively reduce the parasitic capacitance between the first electrodes. In addition, the process for filling the gap with nitrogen is also simple, and the nitrogen atmosphere is more advantageous for extending the lifetimes of the various components in the display substrate.

In some embodiments, the first electrode layer 100 is an anode layer and the second electrode layer 300 is a cathode layer. In other embodiments, the first electrode layer 100 is a cathode layer and the second electrode layer 300 is an anode layer.

The first electrode 110 included in the first electrode layer 100 may be a metal electrode such as an aluminum electrode. The first electrode 110 included in the first electrode layer 100 may also be a non-metal electrode such as an indium tin oxide (ITO) electrode.

For embodiments of the present disclosure, the dielectric constant of the gap is much smaller than the dielectric constant of the pixel defining layer. Compared with filling the pixel defining layer material between the first electrodes, the parasitic capacitance C between the first electrodes can be significantly reduced by separating the first electrodes by a gap. This can reduce the crosstalk between pixels while satisfying the requirements on the area s of an electrode and the spacing d between electrodes, thereby improving the display performance.

Figure 3A:
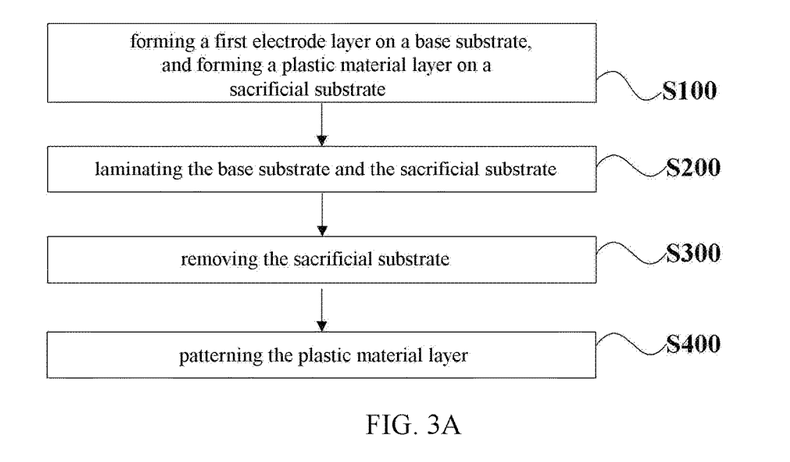
FIG. 3A is a flow chart schematically showing a manufacturing method for a display substrate according to some embodiments of the present disclosure.

FIG. 3A is a flow chart that schematically shows a manufacturing method for a display substrate according to some embodiments of the present disclosure.

As shown in FIG. 3A, the manufacturing method for a display substrate comprises: step S100, forming a first electrode layer on a base substrate, the first electrode layer including a plurality of first electrodes separated from each other by gaps, and forming a plastic material layer on the sacrificial substrate; step S200, laminating the base substrate and the sacrificial substrate; step S300, removing the sacrificial substrate; and step S400, patterning the plastic material layer.

Some embodiments of the manufacturing method for a display substrate are described below in conjunction with FIGS. 4, 5A, 6A, 7, and 8.

Figure 4:
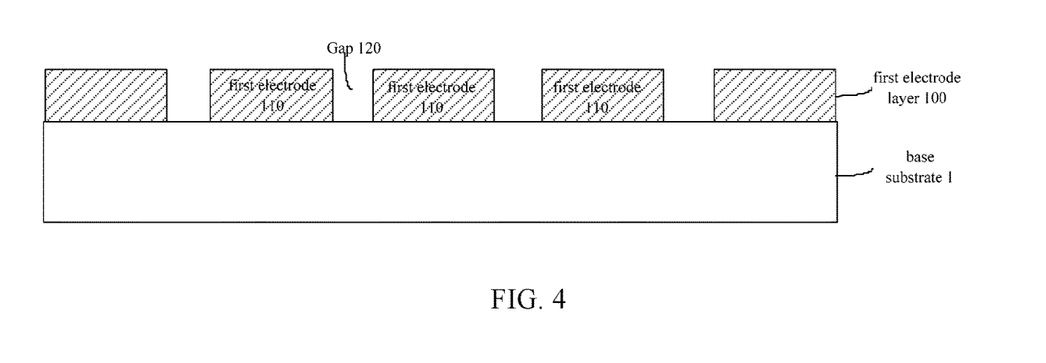
FIG. 4 is a view illustrating formation of a first electrode layer on a base substrate according to some embodiments of the present disclosure.

At step S100, a first electrode layer 100 is formed on a base substrate 1, resulting in a structure as shown in FIG. 4. As shown in FIG. 4, the first electrode layer 100 formed includes a plurality of first electrodes 110 separated from each other by gaps 120.

Figure 5A:
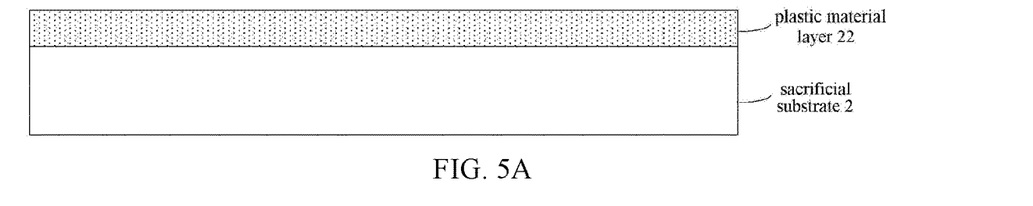
FIG. 5A is a view illustrating formation of a plastic material layer on a sacrificial substrate according to some embodiments of the present disclosure.

At step S100, a plastic material layer 22 is formed on a sacrificial substrate (also referred to as a mother substrate) 2, resulting in a structure as shown in FIG. 5A. Those skilled in the art may select suitable plastic material and formation process as needed. For example, a polyimide (PI) film may be coated on the sacrificial substrate 2 as the plastic material layer 22. It is to be understood that the thickness of the plastic material layer 22 may also be set as needed, which can be set for example in the range of 2 to 4 microns to ensure the performances of other layers subsequently formed on the plastic material layer.

Formation of the first electrode layer and formation of the plastic material layer in step S100 are performed independently from each other, which, for example, may be performed synchronously or may be performed asynchronously.

Figure 6A:
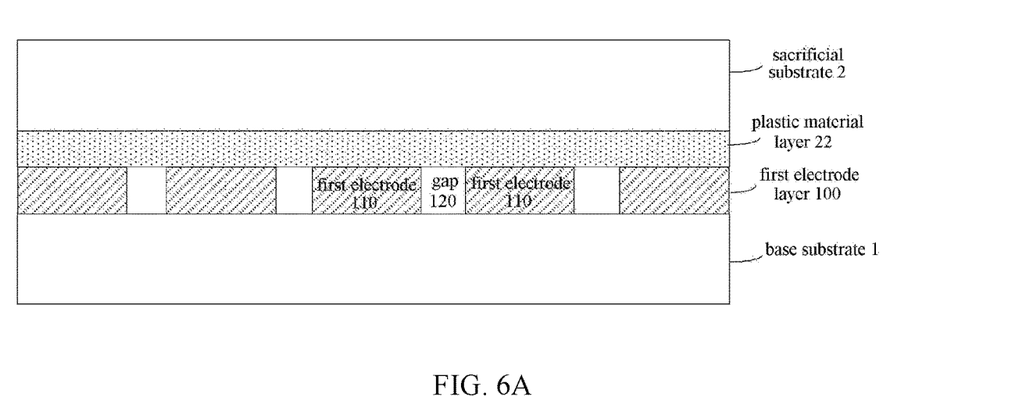
FIG. 6A is a view illustrating the sacrificial substrate and the base substrate after being laminated according to some embodiments of the present disclosure.

At step S200, the base substrate 1 and the sacrificial substrate 2 are laminated, so that the plastic material layer 22 is adhered to the plurality of first electrodes 110 of the first electrode layer 100, resulting in a structure as shown in FIG. 6A. As shown in FIG. 6A, gaps 120 separating the plurality of first electrodes 110 are located between the base substrate 1 and the plastic material layer 22. It can also be seen from FIG. 6A that the gap 120 enclosed by adjacent first electrodes 110, the plastic material layer 22 and the base substrate 1 is a cavity.

Those skilled in the art may select a suitable lamination process as needed. In some embodiments, in order to make the plastic material layer and the plurality of electrodes closely adhered to each other after the lamination process, the plastic material layer may be made of a material with high viscosity.

In some embodiments, the base substrate 1 and the sacrificial substrate 2 are laminated by hot pressing. Accordingly, a thermoplastic material layer is formed in step S100 using, for example, a polymer material such as polyimide (PI), polydimethylsiloxane (PDMS), and the like. The temperature of hot pressing depends on the property of the thermoplastic material. For example, in the case where the thermoplastic material is a viscous material such as a PI glue, the temperature of hot pressing is in the range of 200 to 300° C., which can achieve a better adhesion between the plastic material layer and the plurality of first electrodes of the first electrode layer.

Lamination can be performed in different atmospheres. In some embodiments, the base substrate and the sacrificial substrate are laminated in an air atmosphere. Accordingly, the gap will be filled with air. Performing lamination in an air atmosphere is easy to implement and low in cost. In other embodiments, the base substrate and the sacrificial substrate are laminated in a nitrogen atmosphere. Accordingly, the gap will be filled with nitrogen. Performing lamination in a nitrogen atmosphere is simple in process and easy to implement, and the nitrogen atmosphere is more conducive to the operations of various components. In other embodiments, the base substrate and the sacrificial substrate may be laminated in a vacuum atmosphere.

Figure 7:
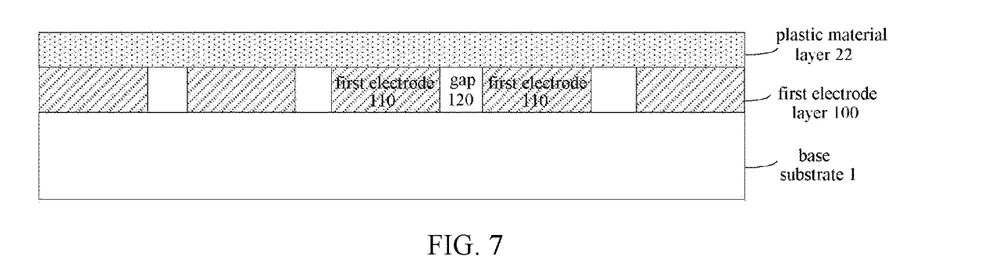
FIG. 7 is a view illustrating a structure where the sacrificial substrate is removed according to some embodiments of the present disclosure.

At step S300, the sacrificial substrate 2 is removed, resulting in a structure as shown in FIG. 7.

In some embodiments, the sacrificial substrate is removed by a stripping process. For example, the sacrificial substrate can be removed using a laser stripping technology. During the stripping process, laser light may be irradiated onto a contact interface between the sacrificial substrate 2 and the plastic material layer 22 as shown in FIG. 6A. The energy of the laser light is able to ablate or decompose the material at the contact interface to thereby separate the sacrificial substrate 2 from the plastic material layer 22. The use of a laser stripping technology is simple in process and easy to implement, which causes a small damage to the material at the interface. Of course, those skilled in the art may also employ other stripping technologies as needed, such as a mechanical stripping technology.

Figure 8:
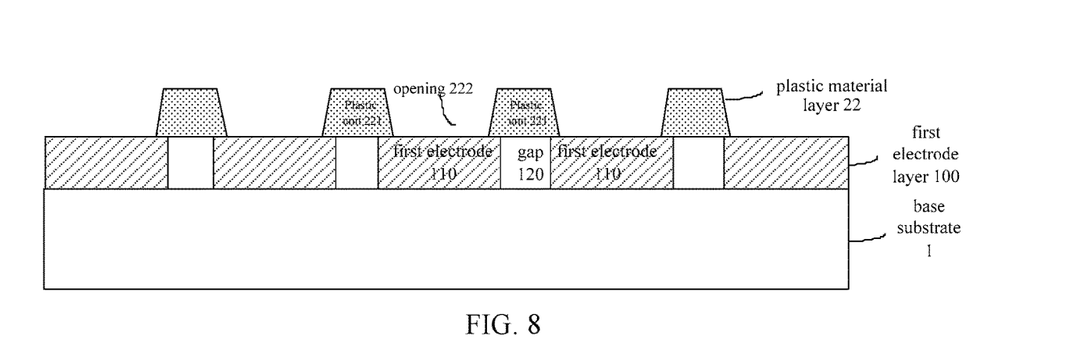
FIG. 8 is a view illustrating a structure where the plastic material layer is patterned according to some embodiments of the present disclosure.

At step S400, the plastic material layer 22 is patterned, resulting in a structure as shown in FIG. 8. As shown in FIG. 8, after the plastic material layer 22 is patterned, the first electrode 110 is exposed, and the gap 120 is still located between the patterned plastic material layer 22 and the base substrate 1.

In some embodiments, the plastic material layer 22 is patterned into a plurality of discrete plastic units 221. An opening 222 is formed between two adjacent plastic units 221. Each plastic unit 221 corresponds to one gap 120 and covers an upper opening of the gap, and each opening 222 corresponds to one first electrode 110 and overlaps an upper surface of the first electrode 110 facing away from the base substrate 1. Each plastic unit 221 connects two adjacent first electrodes 110 across one gap 120. It can be seen that during the patterning process, substantially no change occurs on the periphery of the gap 120, that is, adjacent electrodes 110, the plastic material layer 22 and the base substrate 1 still define a cavity 120.

Those skilled in the art may employ different patterning technologies as needed, such as a photolithography technology, a nanoimprint technology, and the like.

In some embodiments, the plastic material layer 22 is patterned using a nanoimprint technology. In the case where the plastic material layer 22 is a thermoplastic material, patterning can be performed correspondingly using a hot embossing process in the nanoimprint technology. In the hot embossing process, after the pattern in the imprint template is transferred to the heat-softened thermoplastic material, the thermoplastic material is patterned by cooling and solidification. Patterning the plastic material layer with the nanoimprint technology has advantages of low cost, fast speed and high precision.

Figure 3B:
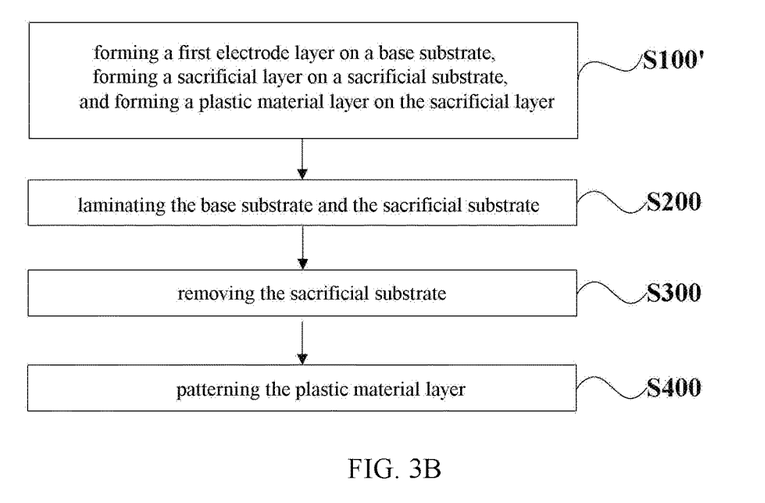
FIG. 3B is a flow chart schematically showing a manufacturing method for a display substrate according to another embodiment of the present disclosure.

FIG. 3B is a flow chart schematically showing a manufacturing method for a display substrate according to another embodiment of the present disclosure.

FIG. 3B differs from FIG. 3A in that step S100' replaces step S100. More specifically, the step S100' in FIG. 3B is different from the step S100 in FIG. 3A in the process of forming the plastic material layer. The difference between the manufacturing methods for a display substrate as shown in FIG. 3B and FIG. 3A will be described below with reference to FIGS. 5B and 6B. The similarities will not be described again.

Figure 5B:
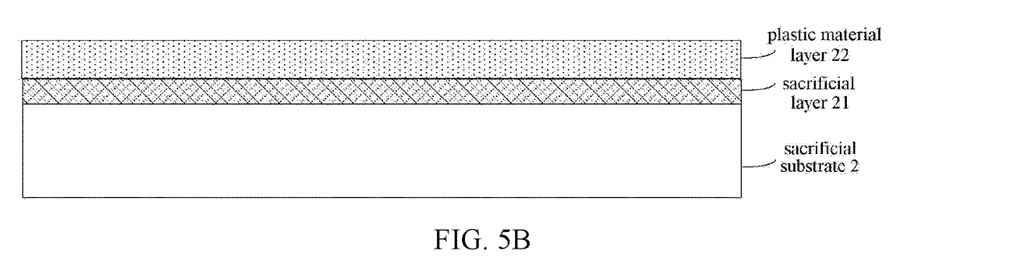
FIG. 5B is a view illustrating formation of a plastic material layer on a sacrificial substrate according to another embodiment of the present disclosure.

At step S100', a sacrificial layer 21 is first formed on the sacrificial substrate 2, and the plastic material layer 22 is then formed on the sacrificial layer 21, resulting in a structure as shown in FIG. 5B. On such basis, the base substrate 1 and the sacrificial substrate 2 are laminated, resulting in a structure as shown in FIG. 6B.

Figure 6B:
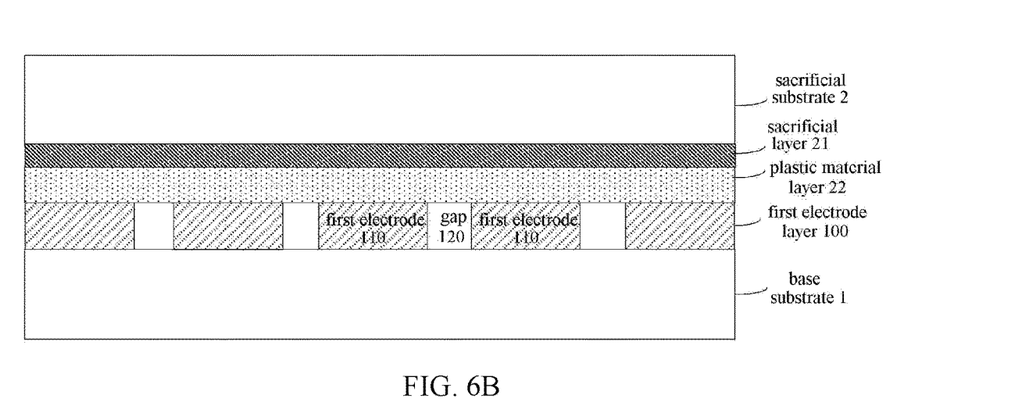
FIG. 6B is a view illustrating the sacrificial substrate and the base substrate after being laminated according to another embodiment of the present disclosure.

As shown in FIGS. 5B and 6B, the sacrificial layer 21 is located between the sacrificial substrate 2 and the plastic material layer 22. The sacrificial layer 21 can protect the sacrificial substrate 2 and the plastic material layer 22 from damage during the process of removing the sacrificial substrate 2. For example, when the sacrificial substrate 2 is stripped by laser light, the laser light may be irradiated onto the sacrificial layer 21 to ablate or decompose the sacrificial layer 21, thereby separating the sacrificial substrate 2 from the plastic material layer 22. That is, the sacrificial layer 21 and the sacrificial substrate 2 are removed by laser stripping. The sacrificial layer 21 is formed of any material that is easily ablated or decomposed when stimulated by external conditions (for example, irradiation of laser light), and no limitation is imposed on the specific material of the sacrificial layer in the present application.

Figure 3C:
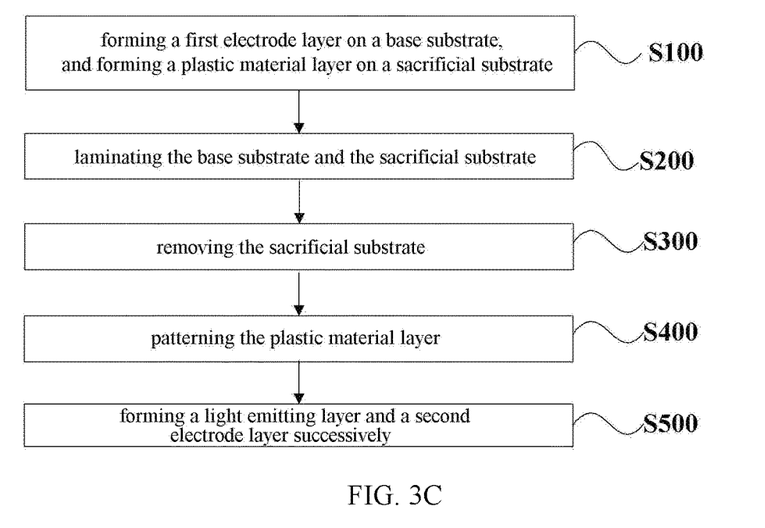
FIG. 3C is a flow chart schematically showing a manufacturing method for a display substrate according to a further embodiment of the present disclosure.

FIG. 3C is a flow chart schematically showing a manufacturing method for a display substrate according to a further embodiment of the present disclosure. FIG. 3C is different from FIG. 3A in that the manufacturing method for a display substrate further comprises step S500. Step S500 will be described below in conjunction with FIG. 2. The similarities will not be described again.

At step S500, after patterning the plastic material layer 22, a light emitting layer 200 and a second electrode layer 300 are formed on the first electrode layer 100 successively, resulting in a structure as shown in FIG. 2. As shown in FIG. 2, the patterned plastic material layer is between the second electrode layer 300 and the first electrode layer 100, and the second electrode layer 300 is in contact with and covers the upper surfaces of the patterned plastic material layer and the light emitting layer facing away from the base substrate. Further, the thickness of the patterned plastic material layer in a vertical direction perpendicular to the base substrate is greater than the thickness of the light emitting layer in the vertical direction. The thickness of the second electrode layer 300 may be uniform, thus the profile of the upper surface of the second electrode layer 300 is substantially the same as the surface profile of the pixel defining layer 20. Here, the pixel defining layer 20 may be formed by patterning the plastic material layer 22 at a lower process cost.

In the foregoing embodiments, by introducing a gap between the pixel electrodes (for example, the first electrodes 110 of the OLED display panel) of the display substrate, the parasitic capacitance C is between the pixel electrodes can be reduced, for example, by 2 to 6 times, which significantly reduces the crosstalk current between pixels and improves the display quality.

An embodiment of the present disclosure further provides a display device comprising any of the display substrates described above. The display device may be any product or component having a display function, such as a mobile phone, a tablet computer, a television, a display, a notebook computer, a digital photo frame, a navigator, and the like.

So far, various embodiments of the present disclosure have been described in detail. In order to avoid obscuring the concept of the present disclosure, some details known in the art are not described. Those skilled in the art based on the above description can fully understand how to implement the technical solutions disclosed herein.

While some specific embodiments of the present disclosure have been described in detail by way of example, it should be understood that the above examples are intended to illustrate the disclosure only, rather than limit the scope thereof. Those skilled in the art will appreciate that modifications may be made to the above embodiments or equivalent substitutions may be made for some of the technical features without departing from the scope and spirit of the present disclosure. The scope of the present disclosure is defined by the appended claims.

The invention claimed is:

1. A display substrate comprising:
   a base substrate;
   a pixel defining layer; and
   a first electrode layer between the base substrate and the pixel defining layer,
   wherein the pixel defining layer defines a plurality of sub-pixels on the base substrate,
   wherein the first electrode layer comprises a plurality of first electrodes and a gap between adjacent first electrodes of plurality of first electrodes,
   wherein the adjacent first electrodes of the plurality of first electrodes are independent and separated from each other by the gap, and
   wherein an orthographic projection of the pixel defining layer on the base substrate covers an orthographic projection of the gap on the base substrate,
   wherein each of the plurality of sub-pixels comprises a first one of the plurality of first electrodes, a light emitting layer, and a second electrode, wherein the light emitting layer is between the first one of the plurality of first electrodes and the second electrode,
   wherein respective second electrodes of the plurality of sub-pixels are connected to each other to form a second electrode layer,
   wherein the first electrode layer and the pixel defining layer are stacked in sequence on the base substrate in a vertical direction perpendicular to the base substrate, the second electrode layer directly contacts and covers upper surfaces of the pixel defining layer, and the light emitting layer facing away the base substrate, and
   wherein a lower surface of the pixel defining layer facing the base substrate directly contacts upper surfaces of the adjacent first electrodes of the plurality of first electrodes facing away the base substrate, such that the base substrate, the pixel defining layer and the adjacent first electrodes of the plurality of first electrodes form the gap.

2. The display substrate according to claim 1, wherein the gap comprises a vacuum gap.

3. The display substrate according to claim 1, wherein the gap comprises air.

4. The display substrate according to claim 1, wherein the gap comprises nitrogen.

5. The display substrate according to claim 1,
   wherein a thickness of the pixel defining layer in the vertical direction perpendicular to the base substrate is greater than a thickness of the light emitting layer of each of the plurality of sub-pixels in the vertical direction.

6. A display device comprising:
   the display substrate according to claim 1.

7. A manufacturing method for a display substrate, comprising:
   forming a first electrode layer on a base substrate, the first electrode layer comprising a plurality of first electrodes and gaps between adjacent first electrodes of plurality of first electrodes, the adjacent first electrodes of the plurality of first electrodes being independent and separated from each other by the gaps;
   forming a plastic material layer on a sacrificial substrate;
   laminating the base substrate and the sacrificial substrate to adhere the plastic material layer to the plurality of first electrodes, such that the first electrode layer is located between the base substrate and the plastic material layer;
   removing the sacrificial substrate; and
   patterning the plastic material layer to obtain a plurality of plastic units, such that at least a portion of each first electrode of the plurality of first electrodes are exposed and the gaps are not exposed, wherein orthographic projections of the plurality of plastic units on the base substrate cover orthographic projections of the gaps on the base substrate.

8. The manufacturing method according to claim 7, wherein the manufacturing method further comprises:
   after patterning the plastic material layer, forming a light emitting layer and a second electrode layer on the first electrode layer successively.

9. The manufacturing method according to claim 8,
   wherein the patterned plastic material layer is between the second electrode layer and the first electrode layer, and
   wherein the second electrode layer is in contact with and overlaps upper surfaces of the patterned plastic material layer and the light emitting layer facing away from the base substrate.

10. The manufacturing method according to claim 9, wherein a thickness of the patterned plastic material layer in a vertical direction perpendicular to the base substrate is greater than a thickness of the light emitting layer in the vertical direction.

11. The manufacturing method according to claim 7, wherein the plastic material layer comprises a thermoplastic material.

12. The manufacturing method according to claim 11, wherein the base substrate and the sacrificial substrate are laminated by hot pressing.

13. The manufacturing method according to claim 7, wherein laminating the base substrate and the sacrificial substrate comprises:

laminating the base substrate and the sacrificial substrate in an air or nitrogen atmosphere.

14. The manufacturing method according to claim 7, wherein laminating the base substrate and the sacrificial substrate comprises:
    laminating the base substrate and the sacrificial substrate in a vacuum environment.

15. The manufacturing method according to claim 7, wherein the manufacturing method comprises:
    forming a sacrificial layer on the sacrificial substrate prior to forming the plastic material layer on the sacrificial substrate.

16. The manufacturing method according to claim 15, wherein removing the sacrificial substrate comprises irradiating the sacrificial layer with laser light to remove the sacrificial substrate.

17. The manufacturing method according to claim 7, wherein patterning the plastic material layer comprises patterning the plastic material layer using a nanoimprint process.

* * * * *